United States Patent [19]

Naarmann et al.

[11] 4,407,739
[45] Oct. 4, 1983

[54] PREPARATION OF ELECTRICALLY CONDUCTIVE POLYMERS

[75] Inventors: Herbert Naarmann, Wattenheim; Klaus Penzien, Frankenthal; Johannes Schlag, Ludwigshafen, all of Fed. Rep. of Germany

[73] Assignee: BASF Aktiengesellschaft, Fed. Rep. of Germany

[21] Appl. No.: 344,020

[22] Filed: Jan. 29, 1982

[30] Foreign Application Priority Data

Feb. 7, 1981 [DE] Fed. Rep. of Germany ....... 3104408

[51] Int. Cl.$^3$ .............................................. H01B 1/02
[52] U.S. Cl. ................................... 252/512; 252/518; 252/500; 528/492; 525/375; 525/377; 524/86; 524/99; 524/198
[58] Field of Search ....................... 252/500, 518, 512; 526/285; 525/374, 375, 376, 377, 378; 528/491, 492; 524/198, 199, 99, 86, 200, 259

[56] References Cited

U.S. PATENT DOCUMENTS 4,204,216  5/1980  Heeger ................................. 252/500
4,222,903  9/1980  Heeger et al. ...................... 252/518
4,269,738  5/1981  Pez et al. ............................ 252/518

OTHER PUBLICATIONS

Macromolecular Syntheses, Collective vol. 1, (1979), pp. 109-110.
Naturwissenschaft 56, (1969), pp. 308-313.
R. Gehm und W. Kern: "Makromolekulare Chemie" 7, (1951), pp. 46-61.
Macromolekulare Synthesis 6, (1978), pp. 45-48.
Hatano: "Journal of Chemistry Society", Japan Ind. Chem. Sect. 65 (1962), pp. 723 et seq.
D. J. Berets et al., "Trans. Farad. Soc." 64, (1968), pp. 823-828.
H. Shirakawa et al., "Journal Chem. Soc., Chem. Comn." (1977), pp. 578-780.
Berichte Bunsengesellschaft "Physikalische Chemie" 68, (1964), pp. 558-567.
J. Org. Chem. 29, (1964), pp. 2936-2938.

Primary Examiner—Josephine Barr
Attorney, Agent, or Firm—Keil & Witherspoon

[57] ABSTRACT

A process for the preparation of electrically conductive polymers which have conductivities greater than $10^{-2}$ S/cm and possess improved stability to oxygen, comprising treating an organic unsaturated polymer of the series of the polyphenylenes, heterophenylenes and polyacetylenes, in the absence of moisture and of oxygen, first with an organic nitroso compound and then with a conventional dopant, the latter being, in particular $H_2SO_4$, $AsF_5$, $SbF_5$, $UF_6$, $SbCl_5$, $AlCl_3$, $BF_3$, $CF_3SO_3H$, $VOCl_3$, $HClO_4$, $NO^+SbF_6^-$, $NO_2^+SbF_6^-$, $NO^+AsF_6$, $NO^+PF_6^-$, $I_2$, $Br_2$, $ICl$, $PF_5$, $CrO_2Cl_2$, $NO_2^+PF_6^-$, $NO^+BF_4^-$, $NO^+ClO_4^-$, $(CF_3)_2SO_4$, $NbF_5$, $TaF_5$, $WF_6$, $FeCl_3$, $CdCl_2$, 2,4,6-trinitrophenol, 2,4,6-trinitrophenylsulfonic acid or 2,4,6-trinitrophenylcarboxylic acid or lithium, sodium, potassium, calcium, barium, radium or an amide of these metals.

6 Claims, No Drawings

PREPARATION OF ELECTRICALLY CONDUCTIVE POLYMERS

The present invention relates to a process for the preparation of electrically conductive polymers which have conductivities greater than $10^{-2}$ S/cm and possess improved stability to oxygen, and to the electrically conductive polymers obtained by this process.

The preparation of organic polymers of the polyphenylene series by oxidative coupling has been disclosed in Macromolecular Syntheses Collective, 1 (1979), 109–110, and Naturwiss, 56 (1969), 308–313. Moreover, the preparation of polyphenylenes by stepwise polycondensation has been disclosed by R. Gehm and W. Kern, Makromol. Chem. 7 (1951), 46–61; this in particular gives homogeneous para-linked methyl-substituted derivatives, which are not contaminated by ortho-linked or meta-linked polymers. The organic polymers of the heteropolyphenylene series differ from the polyphenylenes in that hetero-atoms, or groups containing hetero-atoms, are present between the aromatic ring systems. Suitable hetero-atoms are in particular sulfur and oxygen, but can also be nitrogen. These polymers are described in, for example, Macromol. Synthesis 6 (1978), 45–48. The preparation of organic polymers of the polyacetylene series by polymerizing acetylene has also been disclosed, for example by Hatano in J. Chem. Soc. Japan, Ind. Chem. Sect., 65 (1962), 723 et seq. and by D. J. Berets et al. in Trans.-Farad. Soc. 64 (1968), 823 et seq. A more recent publication by H. Shirakawa et al., J. Chem. Soc., Chem. Comn., (1977), 578–580, also describes the polymerization of acetylene with Ziegler catalysts, to give polyacetylene. The above methods give products which are completely insoluble in conventional solvents and are obtained as black amorphous to partially crystalline materials. This is also true of the materials described in Ber. Bunsenges. Phys. Chem., 68 (1964), 558–567.

Moreover it is known that these polyphenylenes, heteropolyphenylenes or polyacetylenes can be converted into electrically conductive polymers by doping them with suitable compounds, such as either strong Lewis acids having a $pK_a$ of from $-10$ to $+4$, or bases having Pauling electronegativities of up to 1.5 (cf., for example, German Laid-Open Applications DOS No. 2,929,366 and DOS No. 2,929,367 and European Patent Application No. 3-0036,118). However, the electrically conductive polymers thus obtained have only low stability to oxygen and are therfore very easily damaged by oxidation.

It is an object of the present invention to convert the conventional organic unsaturated polymers, of the series of the polyphenylenes, heteropolyphenylenes or polyactylenes, by means of suitable additives, into electrically conductive polymers which have conductivities greater than $10^{-2}$ S/cm and possess substantially improved stability to oxidative damage and thus to substantially improve their processability and extend their range of uses.

We have found that this object is achieved by a process wherein an organic unsaturated polymer from the series of the polyphenylenes, heteropolyphenylenes or polyacetylenes is treated, in the absence of moisture and of oxygen, first with from 0.1 to 10.5% by weight, based on the polymer, of an organic nitroso compound and then with from 0.5 to 55% by weight, based on the organic polymer employed, of a conventional dopant, in particular a strong Lewis acid having a $pk_a$ of from $-10$ to $+4$ or a base having a Pauling electronegativity of up to 1.5.

Examples of strong Lewis acids having $pk_a$ values of from $-10$ to $+4$ include $H_2SO_4$, $AsF_5$, $SbF_5$, $UF_6$, $SbCl_5$, $AlCl_3$, $BF_3$, $CF_3SO_3H$, $VOCl_3$, $HClO_4$, $NO^+SbF_6^-$, $NO_2^+SbF_6^-$, $NO^+AsF_6^-$, $NO^+PF_6^-$, $I_2$, $Br_2$, $ICl$, $PF_5$, $CrO_2Cl_2$, $NO_2^+PF_6^-$, $NO^+BF_4^-$, $NO^+ClO_4^-$, $(CF_3)_2SO_4$, $NbF_5$, $TaF_5$, $WF_6$, $FeCl_3$, $CdCl_2$, 2,4,6-trinitrophenol, 2,4,6-trinitrophenylsulfonic acid and 2,4,6-trinitrophenylcarboxylic acid. Examples of bases with Pauling electronegativities of up to 1.5 include lithium, sodium, potassium, rubidium, calcium, barium, radium and the amides $MNH_2$, where M is lithium, sodium, potassium or rubidium.

Examples of suitable organic nitroso compounds are: ethyl N-nitroso-N-methylcarbamate, N-nitroso-N-methyl-urethane, 1-nitroso-naphth-2-ol, 2-nitrosonaphth-1-ol, the ammonium salt of 4-nitroso-N-phenylhydroxylamine (Cupferron), 2-nitroso-toluene, 5-nitroso-2,4,6-triaminopyrimidine, 3-nitrosostyrene, ω-nitrosostyrene, nitrosobenzene, nitroso-tert.-butane, N-nitroso-dimethylamine, 4-nitroso-N-dimethylaniline, N-(N-nitrosomethylamino)-methyl-benzamide, 2-nitroso-2-naphthol-3,6-disulfonic acid, N-nitrosopyrrolidone and 4-nitroso-phenyl.

The polyphenylenes to be employed in the process according to the invention can be prepared by the methods mentioned at the outset. Their molecular weight is in general from about 250 to 5,000.

Suitable heteropolyphenylenes are, in particular, those of the general formula

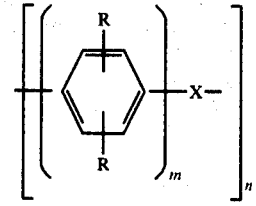

where
X is $SO_2$, S, O, NH, Se or

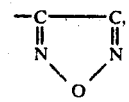

R is H, $CH_3$, phenyl or cyclohexyl,
m is from 1 to 5, preferably 1 or 2, and
n is from 5 to 1,000 preferably from 5 to 500.

Heteropolyphenylenes with the phenyl rings linked by S or O in the para-position are preferred. The heteropolyphenylenes in general have a molecular weight of from about 500 to 500,000, preferably from 1,000 to 100,000, and can be prepared by the methods described in the literature quoted at the outset.

The preparation of organic polymers of the polyacetylene series by polymerization of acetylene is known, cf. the literature quoted at the outset.

For the purposes of the present invention, the phrase "organic polymers of the polyacetylene series" includes not only polyacetylene itself, ie. $(CH)_x$, but also copolymers of acetylene with dialkynes and/or polyalkynes, eg. butadiyne, hexadiyne and octadiyne, as well as substituted polyacetylenes in which some or all of the hydrogen atoms on the polymer chain have been replaced by halogen (especially Cl, Br or I), lower alkyl (especially of 1 to 8 carbon atoms), phenyl radicals (eg. phenyl, halophenyl or alkylphenyl) or by more than one of these substituents. The organic polymers of the polyacetylene series usually have a molecular weight of from about 2,000 to 100,000.

According to the process of the invention, the unsaturated polymers mentioned are mixed, in the absence of moisture (water) and of oxygen, first with from 0.1 to 10.5% by weight, based on polymer employed, of the organic nitroso compound and then with from 0.5 to 55% by weight, based on polymer employed, of a conventional dopant, especially a strong Lewis acid having a $pk_a$ of from $-10$ to $+4$ or a base having a Pauling electronegativity of up to 1.5.

The treatment of the unsaturated polymer with the organic nitroso compound and the dopant is preferably carried out under an inert gas atmosphere, for example a noble gas atmosphere, especially an argon atmosphere. Where appropriate, an auxiliary fluid such as toluene, tetrahydrofuran, dimethoxy glycol, nitromethane or methylene chloride is employed and, after the treatment, is stripped off again, for example under reduced pressure below 30° C. The organic nitroso compound is preferably added as a solution to the unsaturated polymer and is allowed to act at from $-100°$ C. to $+100°$ C., preferably from 0° C. to 70° C., with a reaction time of in general from about 0.1 to 5 hours. The action of the organic nitroso compound can be assisted by suitable measures, for example by shaking in a closed vessel. The organic solvent used to dissolve the organic nitroso compound can subsequently be removed under reduced pressure; advantageously, however, the dopant is added to the unsaturated polymer, which has been treated with the organic nitroso compound, before the said solvent is removed, the reaction of the treated polymer with the dopant being carried out in a conventional manner.

Increases in electrical conductivity of several orders of magnitude can be achieved by the process according to the invention. The organic polymers to be employed according to the invention have initial conductivities of less than $10^{-12}$ S/cm, but after treatment with the organic nitroso compound and the dopant, have conductivities greater than $10^{-2}$ S/cm. The electrical conductivities are measured by the method of F. Beck, Ber. Bunsenges., Phys. Chem. 68 (1964), 558–567, in S/cm at 30° C.

The electrically conductive polymers prepared according to the invention not only have conductivities greater than $10^{-2}$ S/cm, but also possess greatly improved stability to oxygen and are useful for the antistatic treatment of plastics, the production of solar cells, the conversion and fixing of radiation and the production of electrical and magnetic switches and stores. The products obtained by doping with a strong Lewis acid are p-conductors while those obtained with bases are n-conductors.

In the Examples which follow, parts and percentages are by weight, unless stated otherwise.

EXAMPLES 1 TO 18

10 parts of an organic polymer shown in the Table, in powder or film form, are treated, under an argon atmosphere and in the absence of moisture, with the dissolved organic nitroso compound, and are then reacted with the dopant (Lewis acid or base). The electrical conductivity is measured by the method of F. Beck, Ber. Bunsenges., Phys. Chem. 68 (1964), 558–567.

In Example 1, the method used is as follows: 10 parts of a polyacetylene film, prepared by the method of Shirakawa, loc.cit., are mixed with 1 part (corresponding to 10%) of N-nitroso-N-methyl-urethane (II) and 100 parts of toluene, the mixture is shaken (treated) for 3 hours at 60° C., the solution is then decanted and the film is washed with 200 parts of pentane, dried for 5 hours at 0.1 mm Hg and 30° C., and then treated for 6 hours at 50° C. with 5 parts (corresponding to 50%) of HClO$_4$, in the form of a 70% strength aqueous solution. The chlorine content of the product indicates that 0.2 mole % of ClO$_4$ has been incorporated.

In Examples 2 to 18, the procedure followed is similar to Example 1, using the product shown in the Table. The electrically conductive films obtained without the treatment with the organic nitroso compounds according to the invention are stable for only about 0.3–2.5 hours when stored in air, and thereafter the conductivity diminishes continuously. The process according to the invention, on the other hand, gives stabilized films whose conductivity persists for days.

In the Table which follows, the coding of the organic nitroso compounds employed in the Examples is:

I—ethyl N-nitroso-N-methylcarbamate
II—N-nitroso-N-methylurethane
III—N-nitroso-naphth-2-ol
IV—N-nitroso-naphth-1-ol
V—ammonium salt of N-nitroso-N-phenylhydroxylamine
VI—2-nitroso-toluene
VII—5-nitroso-2,4,6-triaminopyridine
VIII—3-nitroso-styrene

TABLE

| Example No. | Organic polymer (10 parts) | Nitroso compound, in % | Dopant Nature and amount in % | | Conductivity in S/cm at 30° C. before addition | Conductivity in S/cm at 30° C. after addition |
|---|---|---|---|---|---|---|
| 1 | Polyacetylene prepared by Shirakawa's method[1] | II 10 | HClO$_4$ | 50 | $10^{-10}$ | $8.6 \times 10^{+2}$ |
| 2 | Polyacetylene prepared by Shirakawa's method[1] | II 0.5 | AsF$_5$ | 50 | $10^{-10}$ | $4.9 \times 10^{+2}$ |
| 3 | Polyacetylene prepared by Shirakawa's method[1] | II 2 | I$_2$ | 55 | $10^{-10}$ | $6.4 \times 10^{+2}$ |
| 4 | Polyacetylene prepared by Shirakawa's method[1] | III 2 | NO$^{30}$PF$_6^-$ | 10 | $10^{-10}$ | $6.9 \times 10^{+2}$ |
| 5 | Polyacetylene prepared by Shirakawa's method[1] | III 10 | CF$_3$COOH | 25 | $10^{-10}$ | $3.8 \times 10^{+2}$ |
| 6 | Polyacetylene prepared by Shirakawa's method[1] | IV 10 | SbF$_5$ | 50 | $10^{-10}$ | $9.5 \times 10^{+2}$ |
| 7 | Polyacetylene prepared by Luttinger's method[2] | I 1 | HClO$_4$ | 30 | $10^{-10}$ | $3.2 \times 10^{+1}$ |

TABLE-continued

| Example No. | Organic polymer (10 parts) | Nitroso compound, in % | Dopant Nature and amount in % | | Conductivity in S/cm at 30° C. | |
|---|---|---|---|---|---|---|
| | | | | | before addition | after addition |
| 8 | Polyacetylene prepared by Shirakawa's method[1] | I 1 | $NbF_5$ | 25 | $10^{-10}$ | $4.5 \times 10^{+1}$ |
| 9 | Polyacetylene prepared by Shirakawa's method[1] | V 1 | $WF_6$ | 30 | $10^{-10}$ | $2.1 \times 10^{+1}$ |
| 10 | Polyacetylene prepared by Shirakawa's method[1] | VI 1 | $NO^+ClO_4^-$ | 25 | $10^{-10}$ | $5.0 \times 10^{+2}$ |
| 11 | Polyacetylene prepared by Shirakawa's method[1] | VII 1 | $H_2SO_4$ | 10 | $10^{-10}$ | $3.8 \times 10^{+1}$ |
| 12 | as in Example 1 | I 1 | Na | 10 | $10^{-10}$ | $3.5 \times 10^{-1}$ |
| 13 | as in Example 1 | II 2 | Naphthalene/Na | 25 | $10^{-10}$ | $4.1 \times 10^{-1}$ |
| 14 | as in Example 1 | III 5 | K | 10 | $10^{-10}$ | $3.0 \times 10^{+1}$ |
| 15 | as in Example 7 | IV 1 | α-Methylstyrene/Na | 10 | $10^{-10}$ | $0.8 \times 10^{-1}$ |
| 16 | as in Example 7 | V 2 | Li | 10 | $10^{-10}$ | $0.8 \times 10^{-1}$ |
| 17 | as in Example 7 | VI 7 | Ba | 10 | $10^{-10}$ | $1.5 \times 10^{+1}$ |
| 18 | as in Example 7 | VIII 10 | K | 15 | $10^{-10}$ | $7.6 \times 10^{+1}$ |

[1] J. Chem. Soc., Chem. Commn. (1977), 578-580
[2] J. Org. Chem., 29 (1964), 2936 et seq.

We claim:

1. A process for the preparation of a stabilized electrically conductive polymer having a conductivity greater than $10^{-2}$ S/cm, comprising treating an organic unsaturated polymer of the series of the polyphenylenes, heteropolyphenylenes or polyacetylenes, in the absence of moisture and of oxygen, first with from 0.1 to 10.5% by weight, based on the polymer, of an organic nitroso compound selected from the group consisting of ethyl N-nitroso-N-methylcarbamate, N-nitroso-N-methylurethane, 1-nitrosonaphth-2-ol, 2-nitrosonaphth-1-ol, the ammonium salt of 4-nitroso-N-phenylhydroxylamine (Cupferron), 2-nitroso-toluene, 5-nitroso-2,4,6-triaminopyridine, 3-nitrosostyrene, ω-nitrosostyrene, nitrosobenzene, nitroso-tert.-butane, N-nitroso-dimethylamine, 4-nitroso-N-dimethylaniline, N-(N-nitrosomethylamino)-methyl-benzamide, 2-nitroso-2-naphthol-3,6-disulfonic acid, N-nitrosopyrrolidone and 4-nitrosophenol, at from −100° C. to +100° C. for from 0.1 to about 5 hours, and then with from 0.5 to 55% by weight, based on the polymer, of a strong Lewis acid dopant having a $pk_a$ of from −10 to +4 or a base having a Pauling electronegativity of up to 1.5.

2. A process as set forth in claim 1, wherein the Lewis acid added is $H_2SO_4$, $AsF_5$, $SbF_5$, $UF_6$, $SbCl_5$, $AlCl_3$, $BF_3$, $CF_3SO_3H$, $VOCl_3$, $HClO_4$, $NO^+SbF_6^-$, $NO_2^+SbF_6^-$, $NO^+AsF_6^-$, $NO^+PF_6^-$, $I_2$, $Br_2$, $ICl$, $PF_5$, $CrO_2Cl_2$, $NO_2^+PF_6^-$, $NO^+BF_4^-$, $NO^+ClO_4^-$, $(CF_3)_2SO_4$, $NbF_5$, $TaF_5$, $WF_6$, $FeCl_3$, $CdCl_2$, 2,4,6-trinitrophenol, 2,4,6-trinitrophenylsulfonic acid or 2,4,6-trinitrophenylcarboxylic acid.

3. A process as set forth in claim 1, wherein the base added is lithium, sodium, potassium, calcium, barium, radium or an amide $MNH_2$, where M is lithium, sodium, potassium or rubidium.

4. A process as set forth in claim 1, wherein the organic nitroso compound is added as a solution.

5. A process as set forth in claim 1, wherein the treatment of the organic unsaturated polymer is carried out in the presence of an auxiliary fluid which is subsequently stripped off again.

6. An electrically conductive polymer obtained by the process as set forth in claim 1.

* * * * *